United States Patent
Dingemanse et al.

[11] Patent Number: 6,061,284
[45] Date of Patent: May 9, 2000

[54] CORE TEST CONTROL

[75] Inventors: Johannes D. Dingemanse, Nijmegen; Erik J. Marinissen, Eindhoven; Clemens R. Wouters, Eindhoven; Guillaum E. A. Lousberg, Eindhoven; Gerardus A. A. Bos, Eindhoven; Robert G. J. Arendsen, Eindhoven, all of Netherlands

[73] Assignee: U.S. Philips Corporation, New York, N.Y.

[21] Appl. No.: 09/179,168

[22] Filed: Oct. 26, 1998

[30] Foreign Application Priority Data

Oct. 31, 1997 [EP] European Pat. Off. .............. 97203378

[51] Int. Cl.[7] ..................................... G11C 7/00
[52] U.S. Cl. ...................... 365/201; 365/189.12; 365/221
[58] Field of Search .............. 365/201, 189.02, 365/189.12, 221; 371/22.3

[56] References Cited

U.S. PATENT DOCUMENTS 5,130,988  7/1992  Wilcox et al. ......................... 371/22.3
5,477,545  12/1995  Huang ..................................... 371/22.3
5,491,666  2/1996  Sturges ..................................... 365/201

*Primary Examiner*—David Nelms
*Assistant Examiner*—David Lam
*Attorney, Agent, or Firm*—Brian J. Wieghaus

[57] ABSTRACT

A integrated circuit (100) includes a plurality of cores (110, 120). With each core (110, 120) is associated a TCB (112, 122) for controlling the core in a test mode thereof. Each TCB has a shift register (220) for holding test control data. The TCBs (112, 122) are serially linked in a chain (140) so that, the test control data can be serially shifted in. A system TCB (130) is provided in the chain (140) comprising a further shift register (220). The system TCB (130) is connected to each TCB (112, 122) for, after receiving a particular set of test control data in its shift register (220), providing the TCBs (112, 122) with a system test hold signal for switching between a shift mode and an application mode of the TCBs (112, 122).

4 Claims, 2 Drawing Sheets

CORE TEST CONTROL

BACKGROUND OF THE INVENTION

The invention relates to an integrated circuit comprising a plurality of cores, with each core being associated a respective core test control block (TCB) for controlling the core in a test mode thereof, each core TCB comprising a core shift register for holding test control data, the core TCBs being serially linked in a chain, each core TCB comprising a first mode for shifting the test control data along the chain and a second mode for applying the test control data to the associated core.

The current trend in IC design is to speed up design time by reusing pre-developed (parameterized) versions of large modules, the so-called cores. Although any such core can have proven to be well-designed by many successful (re-) uses, implementations in silicon have to be tested as production faults always show up. Hereto, the cores that are available to the chip designer are often accompanied by corresponding test schemes that are tailored for the core at hand. Preferably, not only the cores are reused but also their corresponding test schemes. In addition to the cores themselves, also the interconnects between the cores have to be tested.

Both kinds of tests have to be organised on a chip level and possibly be activated and controlled via the chip pins. It is the task of the chip designer to design circuitry herefor. With the number of cores on a chip and their complexity increasing, this task is getting more and more complicated. Furthermore, because the number of available chip pins and the available area are limited, the chip designer has less and less means for performing this task. Specifically, it is a problem how to provide the cores with test control data for controlling the cores during test.

A straightforward approach to that problem is described in U.S. Pat. No. 5,491,666. The known integrated circuit is as described in the preamble. Each core is provided with a core TCB that is essentially a Test Access Port (TAP) controller according to the well known boundary-scan test standard, as defined by IEEE Std. 1149.1. The TAP controllers are linked in a serial chain for serially shifting in the test control data into shift registers. The specification of the TAP controller fits in with such an arrangement, as it prescribes a path between an input node and an output node of the controller via an internal shift register, and a state machine for controlling the shifting in of test control data and the application thereof to the associated core. A problem with such kind of core TCBs is that the state machine is complicated and therefore requires a relatively large area of the integrated circuit. Moreover, a multitude of such core TCBs are required in the integrated circuit.

SUMMARY OF THE INVENTION

It is an object of the invention to provide a more efficient solution to the problem of how to supply the cores with test control data. To this end, a circuit according to the invention is characterized in that a system TCB is provided in the chain, an output of which system TCB being connected to each core TCB for upon the system TCB receiving a particular set of test control data providing the core TCBs with a system test hold signal for switching between the first and the second mode. Such an architecture does not require the complicated state machine of the core TCBs according to the boundary-scan test standard for supplying the core TCBs with test control data. The shifting in and application of test control data is essentially controlled by a very simple system TCB of which only one copy has to be integrated per chain. A further advantage is that only few interconnects between the various TCBs and the system TCB are required.

The invention particularly, but not solely, applies to cores in single substrate integrated circuits. The idea can be extended to any kind of logic devices in a system. Moreover, the core TCBs can be used for controlling both interconnect tests and core tests, such as functional tests, Built-in Self Test (BIST), scan test, quiescent current (IDDQ) test, etc.

An advantage of the measure of claim 2 is that the system test hold signal can be generated very efficiently. Firstly, the shift registers along the chain are resetted to contain initial values, e.g. all zeros. Secondly, a train of test control data is shifted into the chain, a first bit of which being different from the initial value, e.g. one. As soon as that bit reaches the system TCB, the latter can react as all shift registers contain new test control data. Advantageously, an output of the system shift register is used to supply the system test hold signal.

An advantage of the measure of claim 3 is that it provides a very simple architecture of a TCB that fits in with the invention. Both the core TCBs and the system TCB are preferably arranged such.

The invention is further explained below by way of example, with reference to the accompanying drawing.

DESCRIPTION OF THE PREFERRED EMBODIMENTS

Figure 1:
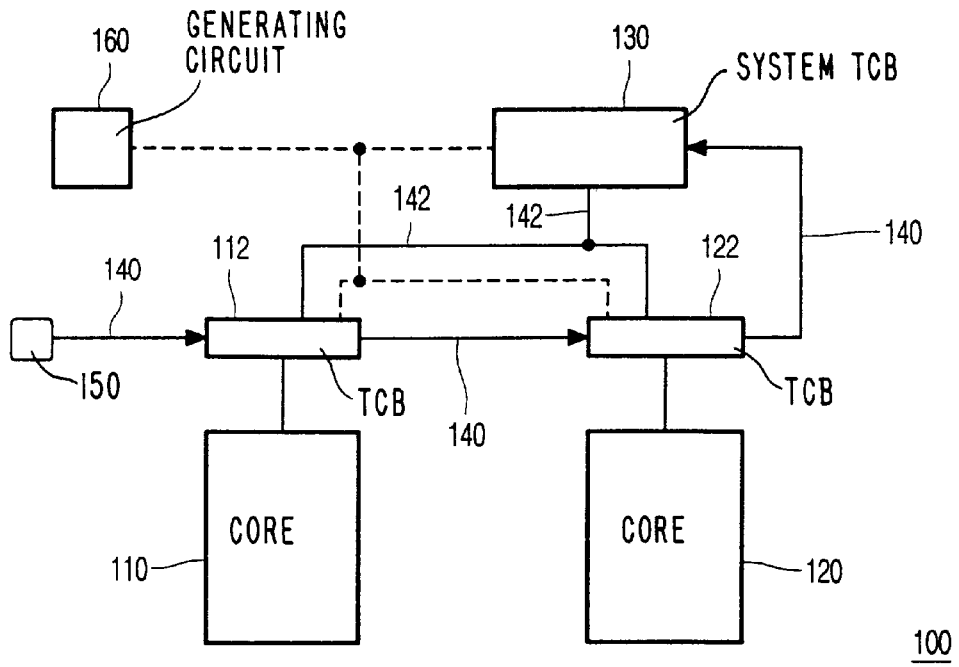
FIG. 1 shows an integrated circuit according to the invention.

FIG. 1 shows an integrated circuit according to the invention. The circuit 100 comprises a core 110 and a core 120, accompanied by a core test control block (TCB) 112 and a TCB 122, respectively. The core TCBs 112, 122 are serially connected to one another to form a chain 140, at the end of which a system TCB 130 is provided. In a first mode of the core TCBs 112, 122, test control data can be shifted in via chip pin 150. After receiving a particular set of test control data, the system TCB 130 puts the core TCBs 112, 122 into a second mode, in which the test control data is applied to the respective cores 110, 120. This mode switching is accomplished by a system test hold signal THLD carried by connection 142. A generating circuit 160 is provided for generating additional signals, such as a reset signal and/or a clock signal.

It is noted that the chain 140 can be used to supply both the test data and the test control data to the cores. However, as the volume of test data with most kinds of tests is very large, it will often be advantageous to supply and extract the test data to and from the cores via a separate test data path. The test data path can then (partly) be made of parallel lines in any kind of structure for a higher bandwidth leading to reduced test times.

By means of the test control data, the core TCBs 112, 122 for example select a particular test of the associated cores 110, 120, such as internal test or interconnect test. The test control data is further used to generate test signals during any of said tests. Furthermore, the core TCBs 112, 122 can be arranged such that appropriate test control data puts any tristate driver outputs of the associated cores 110, 120 to tristate. The core TCBs 112, 122 could additionally be used for, under control of the test control data, controlling the flow of test data, e.g. putting the cores 110, 120 in a bypass mode, the test data on a separate test data rail then bypassing the core.

It is further noted that the number of chains in circuit 100 is not necessarily restricted to one. Different sets of cores can be arranged in separate chains, each chain comprising its own system TCB for controlling the core TCBs contained therein. Moreover, a single chain can even comprise core TCBs in different ICs.

Figure 2:
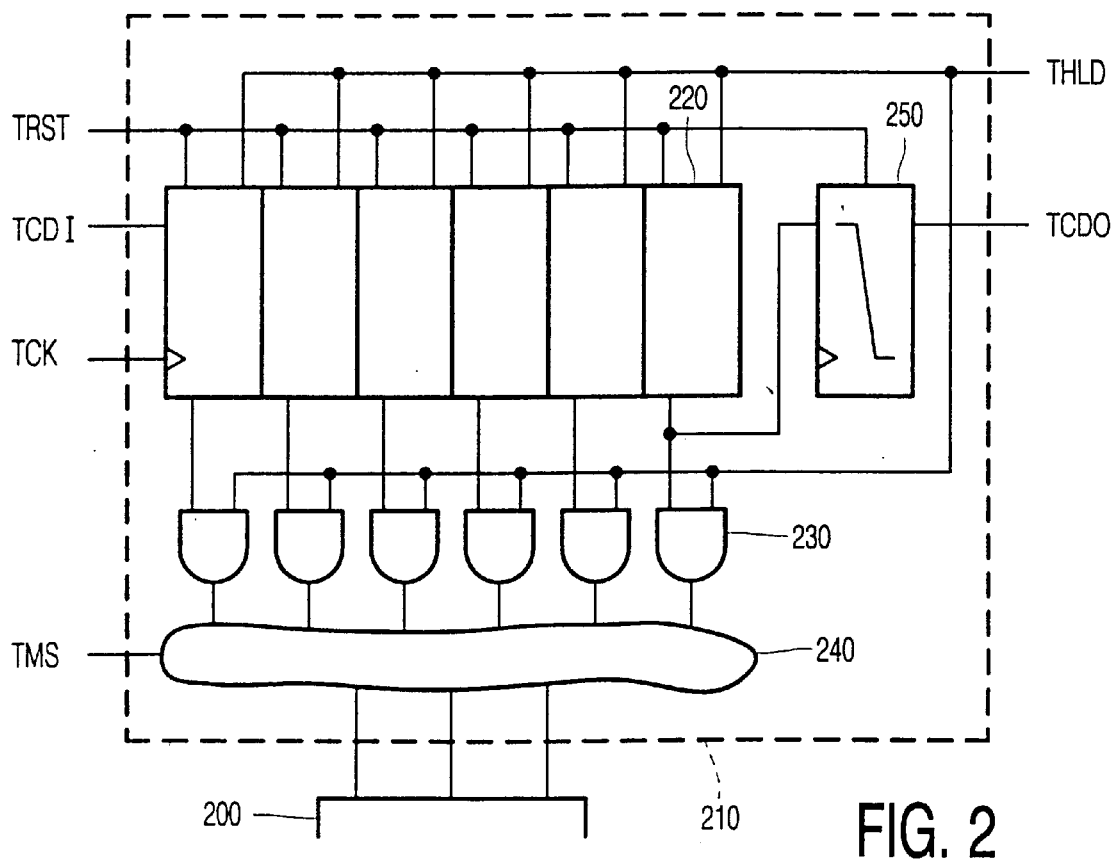
FIG. 2 shows a core TCB according to the invention.

FIG. 2 shows a core TCB for use in the system of FIG. 1. Core TCB 210 comprises a core shift register 220 comprising a number of flip-flops under control of clock signal TCK. Core shift registers of different core TCBs and the system TCB 130 are interconnected via input TCDI and output TCDO, thus forming the chain 140. The core shift register 220 having length of six is solely by way of example. The core shift register length can be adapted to the complexity of the test architecture of the associated core.

An enabling circuit consisting of AND ports 230 is provided for enabling the core shift register's outputs to drive the associated core 200. As long as THLD is low, the AND ports 230 have low outputs. This enabling circuit assures that no test control data element can be active during the shifting in of the test control data. Of course, this function can also be implemented using other logic elements than AND ports 230. Alternatively, circuitry can be provided such that during the first mode, core 200 is invariably provided with previous test control data.

Figure 3:
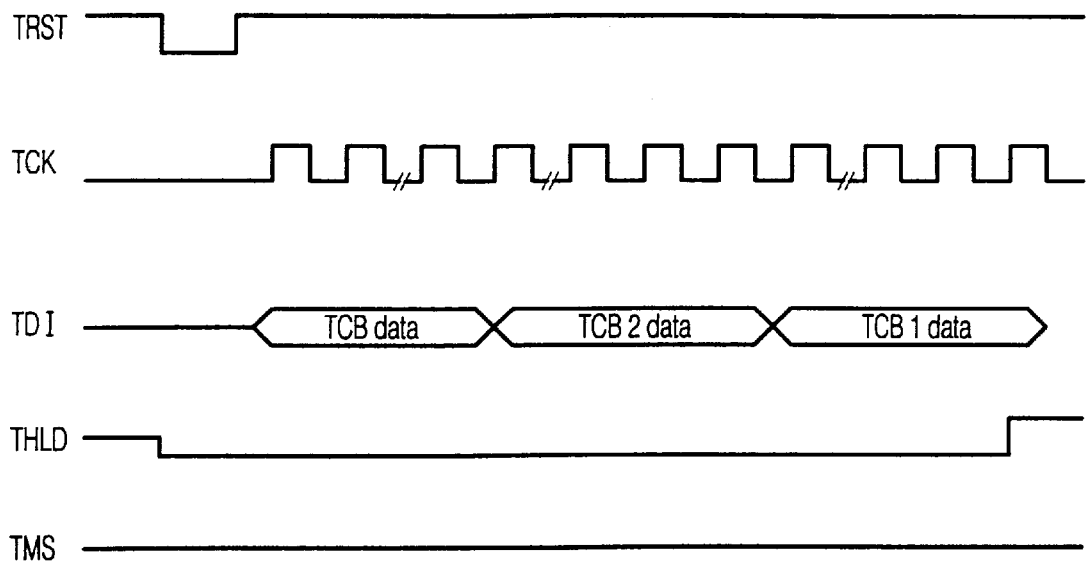
FIG. 3 shows a timing diagram illustrating the signals provided to the core TCB.

After asynchronously resetting the core shift register 220 by reset signal TRST, the flip-flops contain 0s. THLD is low putting the core TCB 210 in a first mode such that test control data can be shifted in via TCDI. At the same time THLD drives the AND ports 230 to low output so that no harm can be done to the core while shifting in the test control data. After the test control data is shifted in, THLD is made high. This puts the core test control blocks in the second mode, thereby putting an end to the shifting process, irrespective of the signal TCK. Furthermore, the AND ports 230 then enable the core shift register 220 to drive the associated core 200. FIG. 3 shows a timing diagram illustrating the signals provided to the core TCB.

Logic circuitry 240 is provided for translating the generic test control data into signals that are tailored to the core 100. Signal TMS is used to toggle between test mode and normal mode of the core 200. It is noted that signals TRST and TCK are assumed to be generated globally by generating circuit 160 and are fed in parallel to different core TCBs.

Negative edge triggered flip-flop 250 is provided after the last flip-flop of the core shift register 220 to assure that there will be no skew problems due to differences in the arrival time of the clock signal TCK. This will often be necessary as the core TCBs are scattered around the layout. In this embodiment of the invention, the flip-flop 250 is reset through signal TRST together with shift register 220.

Not only the core TCBs preferably have the architecture according to FIG. 2, the system TCB preferably has the same architecture as well. Of course, shift register 220 in that case is a system shift register and output TCDO and negative edge triggered flip-flop 250 are not required, as the system TCB is at the end of the chain. An output of the last flip-flop of the system shift register could be used for supplying the THLD signal. Then, THLD is put to an initial value by resetting the system shift register via the signal TRST. Subsequently, by shifting in test control data THLD can be given a different value. Alternatively, the system TCB can be arranged differently, e.g. in order to make the IC compliant with the boundary-scan test standard.

If the chip designer is to combine cores that already have a core TCB that does not fit into this scheme or with no core TCB at all, he can solve this by adding a core TCB according to FIG. 2 to the core, irrespective of the presence of an existing core TCB. An existing core TCB shall be controlled by the added core TCB.

Figure 4:
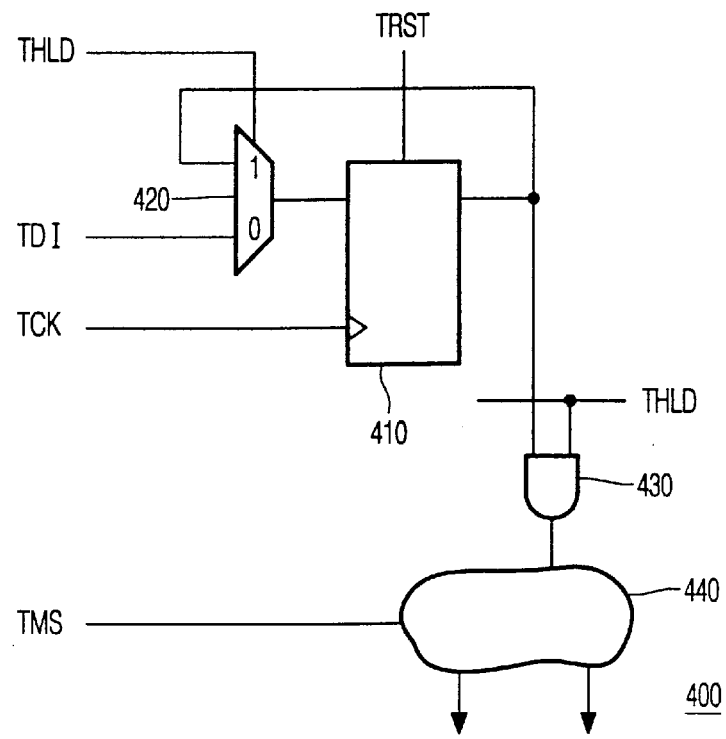
FIG. 4 shows a slice of the core TCB according to the invention.

FIG. 4 shows a slice of the TCB according to the invention. As can be seen from FIG. 2, a core TCB has a very regular structure and consists to a large extent of similar building blocks, the so-called slices. Each such slice 400 comprises a flip-flop 410 under control of the clock signal TCK, a multiplexer 420, an AND port 430 and some glue logic 440. The signal THLD controls the multiplexer 420 to either enable shifting of data along the chain 140 or holding the data in the flip-flop 410. The signal THLD further feeds AND port 430. Under control of the signal TRST flip-flop 410 can be put into an initial state, e.g. storing a 0. The signal TMS selects between the test mode and the normal mode of the associated core.

A description of slices 400 can be part of a library with which core TCBs of the required size can be built by simply adding slices. As suggested earlier on, the system TCB could have substantially the same structure as a core TCB. A first slice of the system TCB can be used for generating THLD. Other slices can be added to control other global test signals. This hierarchy of core and system TCBs has the advantage that global test control data can be dealt with by the system TCB alone and test control data that is specific to a core can be dealt with by the associated TCB of that core exclusively.

Moreover, when the chip designer is supplied with cores having such core TCBs, the chip designer can deal with each core as a black box that has a corresponding a set of test control data. The chip designer is not required to verify whether the core is testable. Alternatively, the chip designer adds a core TCB to a core that does not follow this scheme, the core TCB controlling a possibly existing design specific TCB. He will then have to delve into the specifics of testing of that particular core.

It is noted that when an integrated circuit according to the invention is to be treated as a core on its own, as far as for the test part is concerned, this can be accomplished by removing the system TCB, and possibly dedicated hardware for generating the signals TRST, TCK and TMS. This leads to a new high level core TCB consisting of a string of low level core TCBs.

What is claimed is:

1. An integrated circuit comprising:
   a plurality of cores, a respective core test control block (TCB) associated with each core for controlling the core in a test mode thereof, each core TCB comprising a core shift register for holding test control data, the core TCBs being serially linked in a chain, each core TCB comprising a first mode for shifting the test control data along the chain and a second mode for applying the test control data to the associated core, and
   a system TCB in the chain, an output of which system TCB is coupled to each core TCB such that when the system TCB receives a particular set of test control data the system TCB provides the core TCBs with a system test hold signal for switching between the first and the second mode.

2. An integrated circuit as claimed in claim 1, the system TCB being located at the end of the chain and comprising a system shift register as part of the chain, an output of which system shift register feeding said system TCB output, the integrated circuit further comprising reset circuitry for resetting the core shift registers and the system shift register to an initial state.

3. An integrated circuit as claimed in claim 1, wherein each core shift register comprises a series connection of storage elements, each storage element having an input, a respective multiplexer coupled to each input, a first input of each multiplexer enabling the shifting of test control data along the chain and a second input of each multiplexer being connected to an output of the storage element, the state of the multiplexer being under control of the system test hold signal.

4. An integrated circuit as claimed in claim 3, characterized in that the core shift register of each core TCB is connected to the associated core via an associated enabling circuit having outputs carrying in a first state of the enabling circuit predefined signals and in a second state of the enabling circuit contents of the core shift register, the state of the enabling circuit being under control of the system test hold signal.

* * * * *